United States Patent [19]
Kantz et al.

[11] 4,393,478
[45] Jul. 12, 1983

[54] MONOLITHICALLY INTEGRATED SEMICONDUCTOR MEMORY WITH DUMMY AND CHARGE EQUALIZATION CELLS

[75] Inventors: Dieter Kantz, Munich; Eugen Seher, Grafenau, both of Fed. Rep. of Germany

[73] Assignee: Siemens Aktiengesellschaft, Berlin and Munich, Fed. Rep. of Germany

[21] Appl. No.: 285,344

[22] Filed: Jul. 20, 1981

[30] Foreign Application Priority Data

Jul. 31, 1980 [DE] Fed. Rep. of Germany ....... 3029108

[51] Int. Cl.³ .......................... G11C 7/00; G11C 7/06
[52] U.S. Cl. ..................................... 365/210; 365/205
[58] Field of Search ............... 365/149, 205, 207, 208, 365/210

[56] References Cited

U.S. PATENT DOCUMENTS 4,247,917 1/1981 Tsang et al. ..................... 365/210

FOREIGN PATENT DOCUMENTS 2707456 9/1977 Fed. Rep. of Germany ...... 365/210
54-100233 8/1979 Japan ................................ 365/210

OTHER PUBLICATIONS

Publication "1979 IEEE International Solid-State Circuits Conference," pp. 140/141 and 12/13.

*Primary Examiner*—Stuart N. Hecker
*Attorney, Agent, or Firm*—Herbert L. Lerner; Laurence A. Greenberg

[57] ABSTRACT

Monolithically integrated semiconductor memory having a matrix formed of identical information storage cells arranged in rows and columns in the form of single-transistor storage cells, a respective comparator and a dummy cell, likewise provided by a single-transistor storage cell, being operatively associated either with each matrix column or each matrix row, including a respective second single-transistor storage cell provided as a charge equalization cell and identical, at least with respect to storage capacity with the dummy cell and operatively associated with each of the dummy cells, each of the charge equalization cells respectively having a drive balanced relative to the drive of the dummy cell operatively associated therewith so that, in a first phase triggered by the respective dummy cell having been addressed by an addressing signal, the dummy cell storage capacity is charged and the charging state of the storage capacity of the respective charge equalization cell is set so that the charging state in the charge equalization cell corresponds to the signal inverse to the addressing signal effecting the charging of the dummy cell, so that, in a second operating phase, the storage capacity of the dummy cell and the storage capacity of the charge equalization cell are connected in parallel for charge equalization, and so that, in a third operating phase, the respective storage capacities of the dummy cell and the charge equalization cell are again separated by driving the comparator from the dummy cell.

6 Claims, 6 Drawing Figures

MONOLITHICALLY INTEGRATED SEMICONDUCTOR MEMORY WITH DUMMY AND CHARGE EQUALIZATION CELLS

The invention relates to a monolithically integrated semiconductor memory with a matrix formed of mutually identical information storage cells arranged in rows and columns in the form of single-transistor storage cells, a respective comparator and a comparison cell or dummy cell, likewise provided by a single-transistor storage cell, being associated either with each matrix column or each matrix row.

Semiconductor memories of this general type are operated as dynamic write/read memories, e.g. DRAM memories, and are described, for example, in "1979 IEEE International Solid-State Circuits Conference," pages 140/141 and 12/13, respectively.

In the usual organization of such semiconductor memories, a respective comparator, acting as a differential amplifier, is assigned to each column of the memory matrix, the comparator being located in the middle of the respective column and being represented by a bistable multivibrator. One half of all the single-transistor information storage cells provided per column is connected by the drain terminal to one of the inputs of the differential amplifier, and the remaining memory cells of the respective matrix column, in the same manner, to the other input of the differential amplifier.

In addition, two comparison cells, which are connected to a respective input of the differential amplifier in the same manner as are the information storage cells, are assigned to each column.

This results, in particular, in the circuit shown in FIG. 1 for the individual columns of the memory matrix.

Referring conventionally to the conductors which are associated with the individual matrix rows and connected to the gate electrodes of all the memory cells of the respective matrix row as the "word line," and the conductors associated with the individual matrix columns as the "bit line" then, in the conventional memories of this type, each bit line is halved, and one of the halves is connected to one of the inputs of the differential read amplifier i.e. the comparator, and the other half to the other input of the same amplifier. The number of storage cells provided per column is halved, accordingly, and a respective half of the number of storage cells associated with the respective column is connected to a respective half of the appertaining bit line $B_j$ (j=index).

It is the task of the comparator i.e. the read amplifier, to differentiate whether the "0" state or the "1" state is stored in a memory cell connected thereto by addressing via the appertaining word line, which is required both for the readout process in the evaluation as well as in the regeneration of the respectively stored information. To make the comparison possible, the comparison cell is connected to the other input of the comparator which must then receive a mean voltage level between the two logic levels "0" and "1."

For this purpose, it is necessary that the resultant storage capacity in the comparison cell be half that of the individual information storage cells. It is then possible simply to connect to the two comparator inputs via the respective bit line halves, on the one hand, the information storage cells and, on the other hand, the respective comparison cell. For this purpose, the desired cell of the one bit line half is addressed via the appertaining word line simultaneously with the comparison or dummy cell on the respective other bit line half via the dummy line serving to address the comparison or dummy cell connected to the other bit line half, and therewith connected to a respective input of the comparator associated with the respective bit line. If then the charge present in the addressed information storage cell is greater than the charge present (and constantly being regenerated) in the comparison or dummy cell, the comparator, constructed specifically as a flip-flop, thus transmits the logical signal "1" and, in the other case, the logical signal "0," which is then evaluated or interpreted in a conventional manner.

Thus it is obviously necessary for the individual comparison or dummy cells (or also balancing cells) on the one hand, to furnish a smaller signal, especially a signal half the size of that delivered by the individual information storage cells and, on the other hand, to change the signal-related electrical characteristics thereof as much as possible analogously to the corresponding characteristics of the actual storage cells (i.e. the information storage cells) despite the modification thereof relative to the actual storage cells required for this purpose. To achieve this, one of the following possibilities has been applied to the memory installations heretofore known from the aforecited publication.

(a) The signal voltage to be applied between the individual bit lines $B_j$ and the reference potential(ground) is selected equal to the supply voltage, and the area of the individual comparison or dummy cell determining the storage capacity is selected equal to half the corresponding area of the individual information storage cells. With such a procedure, however, a disadvantage becomes apparent, namely a strong dependence of the operating characteristics on structural changes such as are caused by etching tolerances, for example.

(b) The signal voltage to be applied to the bit lines is selected approximately equal to half the supply voltage, and the area of the individual comparison or dummy cells is selected equal to the area of the individual information storage cells so that the size and structure of the comparison or dummy cells are thus as identical as possible with those of the information storage cells. As experience has shown, this possibility leads, however, to an undefined electrical state of the bit lines in the intervals between the individual interrogation cycles.

It is accordingly an object of the invention to provide a monolithically integrated semiconductor memory which ensures that the disadvantages described in paragraphs (a) and (b) above are avoided without significant extra cost without having to take other disadvantages into consideration.

With the foregoing and other objects in view, there is provided, in accordance with the invention, a monolithically integrated semiconductor memory having a matrix formed of identical information storage cells arranged in rows and columns in the form of single-transistor storage cells, a respective comparator and a dummy cell, likewise provided by a single-transistor storage cell, being operatively associated either with each matrix column or each matrix row, including a respective second single-transistor storage cell provided as a charge equalization cell and identical, at least with respect to storage capacity with the dummy cell and operatively associated with each of the dummy cells, each of the charge equalization cells respectively having a drive balanced relative to the drive of the dummy cell operatively associated therewith so that, in a first phase triggered by the respective dummy cell having been addressed by an addressing signal, the dummy cell storage capacity is charged and the charging state of the storage capacity of the respective charge equalization cell is set so that the charging state in the charge equalization on cell corresponds to the signal inverse to the addressing signal effecting the charging of the dummy cell, so that, in a second operating phase, the storage capacity of the dummy cell and the storage capacity of the charge equalization cell are connected in parallel for charge equalization, and so that, in a third operating phase, the respective storage capacities of the dummy cell and the charge equalization cell are again separated by driving the comparator from the dummy cell.

To apply voltage to the connecting lines (i.e. the bit lines $B_j$ in the preferred embodiment) establishing the connection between the information storage cells and the comparator and between the dummy or comparison cell and the comparator, respectively, the connecting lines are preferably controlled by signals having a logic excursion corresponding to the memory matrix supply voltage. Moreover, the comparison or dummy cells and the other single-transistor storage cells serving for charge equalization are as identical as possible to the single-transistor storage cells for information storage both with respect to the construction as well as the geometry and electrical characteristics thereof and are produced simultaneously therewith.

In accordance with another feature of the invention the semiconductor memory has the construction of a dynamic RAM memory.

In accordance with a further feature of the invention, the information storage cells, the dummy cells and the charge equalization cells respectively formed as single-transistor storage cells are mutually identical and producible together simultaneously.

In accordance with an added feature of the invention, the comparators are formed as differential amplifiers, and the pulses of the addressing signal for the dummy cells having an amplitude equal to that of the supply voltage for the comparators.

In accordance with an additional feature of the invention, the storage capacities of the individual dummy cells and of the charge equalization cells associated therewith, respectively, have a first pole permanently connected to a reference potential, the storage capacities of the dummy cells, respectively having a second pole connected to a bit line operatively associated with the dummy cells via a transfer transistor of the respective dummy cell and also connected via another respective transfer transistor to a second pole of the respective storage capacities of the charge equalization cells associated with the dummy cells, and the second pole of the storage capacities, respectively, of the charge equalization cells being connected to a current-carrying terminal of respective further transfer transistors of the charge equalization cells.

In accordance with a concomitant feature of the invention, the further transfer transistors, respectively, of the charge equalization cells have a gate, the gate and an electrode forming the current-carrying terminal of the further transfer transistors, respectively being acted upon by a respective clock pulse in a manner that before respective activation of the further transfer transistors, respectively, which are controlled by a further clock pulse and which forms the connection of the storage capacity of the dummy cell to the storage capacity of the charge equalization cell, the charge state in the charge equalization cell required for charge equalization between the storage capacities of the dummy cells and the charge equalization cells is set at half the memory charge.

Other features which are considered as characteristic for the invention are set forth in the appended claims.

Although the invention is illustrated and described herein as embodied in a monolithically integrated semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
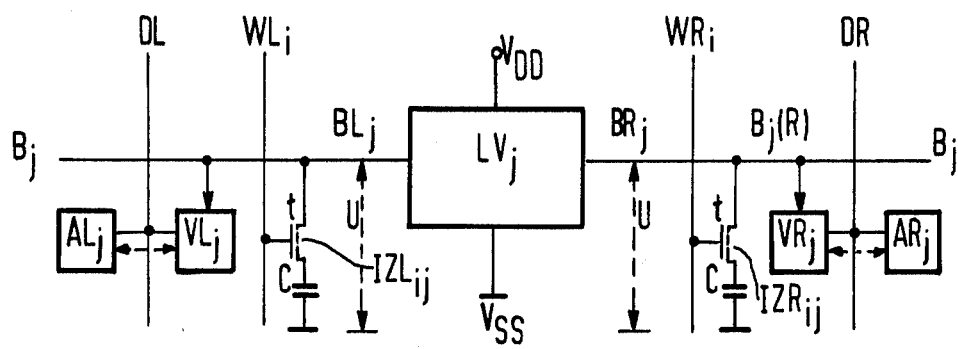
FIG. 1 is part of a circuit diagram of the monolithically integrated semiconductor memory according to the invention, showing the combination between one of the provided n bit lines $B_j$ with comparator $LV_j$ and the comparison dummy cells $VL_j$ and $VR_j$ appertaining thereto, and the information storage cells $IZL_{ij}$ and $IZR_{ij}$, respectively, connected to the respective bit line $B_j$.

Referring now to the drawing and, first, particularly to FIG. 1 thereof, there are shown bit lines $B_j$ assigned to the individual matrix columns j and, as is conventional, also halved, the two halves $BL_j$ and $BR_j$ being jointly addressed. Each bit line half is provided for driving, in the manner apparent from FIG. 1, the same number of information storage cells $IZL_{ij}$ and $IZR_{ij}$, respectively, constructed as single-transistor storage cells, the bit line half $BL_j$ at the left-hand side of FIG. 1 as well as the bit line half $BR_j$ at the right-hand side of FIG. 1 being respectively shown with only one information storage cell $IZL_{ij}$ and $IZR_{ij}$, respectively, in the interest of clarity, the cells $IZL_{ij}$ belonging to the left-hand half and the cells $IZR_{ij}$ to the right-hand half of the bit line $B_j$. The subscript j is the number of the respective bit line $B_j$, running from 1 to n (n=total number of the bit lines $B_j$ and, accordingly, the columns of the memory matrix). The index or subscript represents the number of the row containing the respective cell and runs from 1 to m/2, wherein is the total number of the matrix rows.

The individual information storage cells $IZL_{ij}$ and $IZR_{ij}$, respectively, are formed of an MOS field effect transistor t of the enhancement type having a drain which is connected to the respective bit line half of the bit line $B_j$ and having a source establishing a connection to a pole of a capacitor C which represents the storage capacity of the cell and is constructed especially as a MOS varactor capacitor, the other pole of the capacitor C being connected to ground i.e. to the reference potential. The individual storage cells $IZ_{ij}$ (=$IZL_{ij}$ or $IZR_{ij}$)

are addressed via the word line $W_i$ associated with the respective matrix row. In FIG. 1, the word lines disposed to the left-hand side of the comparator row have the reference symbol $WL_i$, and the word lines disposed to the right-hand side of the comparator row have the reference symbol $WR_i$. Moreover, simultaneously with being addressed via the word line, the individual information-carrying storage cells $IZ_{ij}$ are addressed via the bit line $B_j$ respectively assigned to the appertaining cell.

In addition to the storage cells $IZ_{ij}$ for the information storage, each bit line half $BL_j$ and $BR_j$, respectively, also has a comparison (dummy) cell $VR_j$ and $VL_j$, respectively, as identical as possible to the information-carrying storage cells, the construction and the characteristics thereof. For addressing the comparison or dummy cells $VL_j$ associated with the bit line half $BL_j$ at the left-hand side of FIG. 1, a common addressing line DL is provided corresponding to the word lines $WL_i$, and for jointly addressing the dummy cells $VR_j$ associated with the bit line halves $BR_j$ at the right-hand side of FIG. 1, a similar addressing line DR is provided corresponding to the word lines $WR_j$. In the literature, the addressing lines DL and DR are often called dummy lines (corresponding to the commonly used name dummy cells for the comparison cells).

The respective dummy cell $VL_j$ or $VR_j$ is addressed by the addressing or dummy line DL and DR, respectively, connected to the gate of the transfer transistor thereof and also by the half $BL_j$ and $BR_j$, respectively, of the bit line $B_j$ connected to the drain of the transfer transistor thereof. This addressing is simultaneously connected with charging the storage capacity of the respective dummy cell $VL_j$ or $VR_j$. Since the signal effecting the charging of the storage capacity in the dummy cell $VL_j$ or $VR_j$ and the addressing signal are identical and since the latter corresponds to the state "1" of the bit line $B_j$, the same applies also to the storage capacity of the addressed comparison or dummy cells $VL_j$ and $VR_j$, respectively.

According to the invention, there is assigned to each of the dummy cells $VL_j$ and $VR_j$, respectively, an additional single-transistor storage cell $AL_j$ and $AR_j$, respectively, which is as identical thereto as possible and is addressed and charged jointly with the comparison or dummy cell. Of course, the responsibility for charging the storage capacity of this additional single-transistor storage cell designated as an equalization cell does not lie with the signal used to address the dummy cells $VL_j$ and $VR_j$, respectively, because the storage capacity of the equalization cell $AL_j$ or $AR_j$ should be charged so that the charged state which is attained corresponds to the signal which is inverse to the addressing signal i.e. to the logic state "0."

If, relative to the reference potential $V_{DD}$, the bit line $B_j$ has the potential U when the addressing signal is switched on, so that the voltage U corresponds to the logic level "1," care will be exercised that the storage capacity of the associated equalization cells $AL_j$ and $AR_j$, respectively, are discharged at the same time the capacity of the appertaining dummy cells $VL_j$ and $VR_j$, respectively, are charged so that, with the conclusion of the first phase according to the definition of the invention, the charging state of the storage capacity of the equalization cell is inverted to the charging state "1" of the storage capacity of the appertaining dummy cells $VL_j$ and $VR_j$, respectively, and consequently corresponding to the logic state "0."

The charge equalization between the storage capacitors of the dummy cells $VL_j$ and $VR_j$, respectively, and the appertaining equalization cells $AL_j$ and $AR_j$, respectively, prescribed in accordance with the invention, then occurs in the second phase and is accomplished by connecting the two storage capacitors in parallel. Each of the storage capacitors thereby attains exactly the same charging state so that the charge stored in the storage capacitor of the comparison or dummy cell and the charge stored in the storage capacitor of the associated equalization cell respectively corresponds to a charged state exactly in the middle between the logic levels "0" and "1." If, as is the case in the described example, the charge corresponding to the logic level "1" equals $Q(1)=Q$ and the charge corresponding to the logic level "0" equals $Q(0)=0$, the charge of both storage capacities, after the charge equalization in the second phase, amounts to $Q(0)+(Q(1)-Q(0)):2=Q/2$.

According to the invention, the connection between the storage capacities of the dummy cells $VL_j$ and $VR_j$, respectively, and the appertaining equalization cells $AL_j$ and $AR_j$, respectively, is cut again before the third phase so that the desired or sought after control voltage $U/2$ is available for the control of the comparator $LV_j$ in the comparison or dummy cells $VL_j$ and $VR_j$, respectively, in the then succeeding third phase.

Because the addressing and charging voltage U usually used for applying to the bit lines $B_j$ relative to ground is customarily selected to equal the supply voltage provided to operate the read amplifier i.e. the comparator $LV_j$, it will be expedient to generate the addressing pulses to be supplied for addressing the comparison or dummy cells $VL_j$ and $VR_j$, respectively, via the dummy lines DL or DR, by keying the supply voltage.

The problem underlying the invention is thereby solved.

Figure 2:
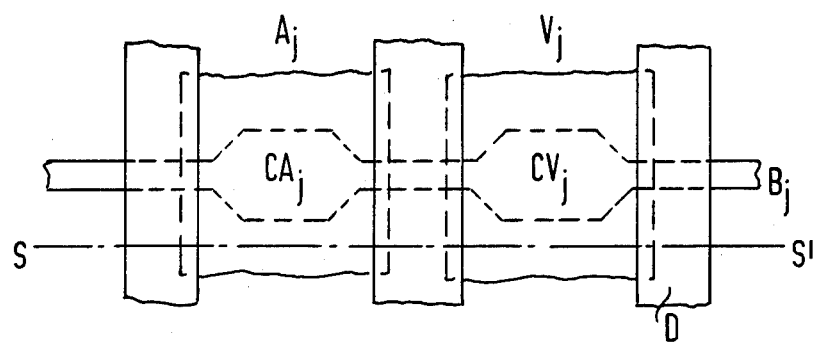
FIGS. 2, 3 and 4 are enlarged fragmentary views of FIG. 1 showing details of the individual comparison or dummy cells and of the appertaining charge equalization cell $AL_j$ and $AR_j$, respectively.
Figure 3:
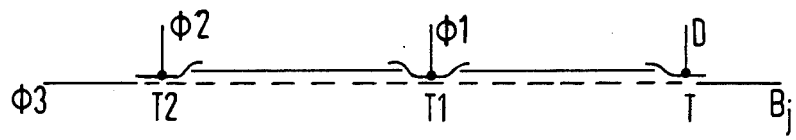
Figure 4:
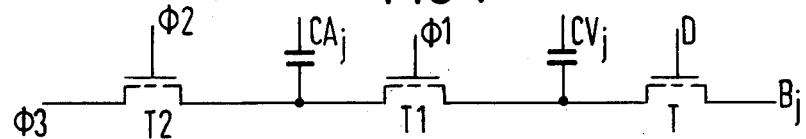

FIG. 2 shows the layout of a combination of a comparison or dummy cell $V_j$ and an equalization cell $A_j$ appertaining thereto while FIG. 3 represents a section of this layout taken along the line S—S' in FIG. 2 and FIG. 4 represents the circuit associated therewith.

As has been stated repeatedly hereinbefore, the dummy or comparison cell $V_j$ and the equalization cell $A_j$ associated therewith are formed, respectively of a single-transistor storage cell corresponding as closely as possible in the dimensions and other characteristics thereof to the individual storage cells $IS_{ij}$ serving for the storage of information. Consequently, both the comparison or dummy cell $V_j$ and the equalization cell $A_j$ have a respective transfer transistor and a respective storage capacitor. Shown in FIGS. 3 and 4 are a transfer transistor T of the dummy or comparison cell, a transfer transistor T2 of the equalization cell and a connecting transistor T1 inserted between the two transfer transistors T and T2 and making possible the charge equalization between the storage capacity $CV_j$ of the dummy cell $V_j$ and the storage capacity $CA_j$ of the equalization cell $A_j$ provided for in the second phase during the operation of the comparison or dummy cell $V_j$ and the equalization cell $A_j$.

Accordingly, the drain of the transfer transistor T of the comparison or dummy cell $V_j$ is connected to a respective one of the two halves of the bit line $B_j$, produced, for example, as diffusion zones in the substrate of opposite conduction type receiving the memory in monolithically integrated form and formed, especially, of monocrystalline silicon. The drain of the transfer transistor T of the dummy cell $V_j$ may be identical with a section of the bit line half formed as a diffusion zone which, besides, also applies to the drains of the transfer transistors t of the information storage cells connected to the respective bit line half ($BL_j$ or $BR_j$).

The gate of the transfer transistor T of the comparison or dummy cell $V_j$ may be identical with a section of the addressing or dummy line D controlling the gate of this dummy cell, as is evident from the layout according to FIGS. 2 and 3, respectively. On the one hand, the source of the transfer transistor T of the dummy cell $V_j$ is connected to the one pole of the appertaining storage capacity $CV_j$, the second pole of which is grounded and is consequently at the reference potential $V_{SS}$. On the other hand, the source of the transfer transistor T of the dummy cell $V_j$ is also connected to the drain of the transfer transistor T1 forming the connection with the appertaining equalization cell $A_j$.

The equalization cell $A_j$ is formed of the storage capacity $CA_j$ and a transfer transistor T2 which permit charging and discharging, respectively, of this storage capacity. The drain of this transfer transistor T2 is connected to the source of the connecting transistor T1, while the source thereof is connected to the one pole of the storage capacity $CA_j$ of the equalization cell $A_j$. A permanent connection of the one pole of the storage capacity $CA_j$ of the equalization cell $A_j$ to the one pole of the storage capacity $CV_j$ of the dummy cell associated therewith is provided, whereas the connection between the two other poles of the two storage capacities is possible exclusively via the source-drain path of the connecting transistor T1 and is formed only during the second phase of operation of the equalization cell and dummy cell.

Finally, the pole of the storage capacity of the equalization cell and the pole of the storage capacity of the dummy cell not connected to the source-drain path of the connecting transistor T1 are connected to the reference potential $V_{SS}$ i.e. to ground. As stated hereinbefore, the source of the transfer transistor T2 of the equalization cell $A_j$ is connected to the first pole of the storage capacity $CA_j$ of the equalization cell $A_j$. In addition, in the first operating phase, while the storage capacity $CV_j$ of the associated dummy cell $V_j$ is being charged by the addressing signal conducted through the bit line $B_j$, the source of the transfer transistor T2 of the equalization cell $A_j$ is connected to the reference potential $V_{SS}$ applied to the second pole of the storage capacity of the equalization cell $A_j$ and, it is in this manner that the desired inverted charging state of the storage capacity $CA_j$ of the equalization cell $A_j$ relative to the charging state of the storage capacity $CV_j$ of the associated dummy cell in the first operating phase is obtained. In the second phase, which serves for charge equalization i.e. during the activation of the transfer transistor T1 forming the connection between the storage capacities of the dummy cell $V_j$ and the equalization cell $A_j$, however, the connection of the first pole of the storage capacity $CA_j$ of the equalization cell $A_j$ to the reference potential $V_{SS}$ remains broken.

The storage capacities $CA_j$ and $CV_j$ of the dummy or comparison cell and the equalization cell are preferably in the form of MOS varactor capacitors. Accordingly, the first pole thereof is provided in the form of a respective conducting electrode (preferably of doped polycrystalline silicon) separated from the substrate zone by a gate oxide film, while the respective second pole is provided by a conducting channel inducting by means of the stated electrode on the substrate surface under the gate oxide.

Figure 5:
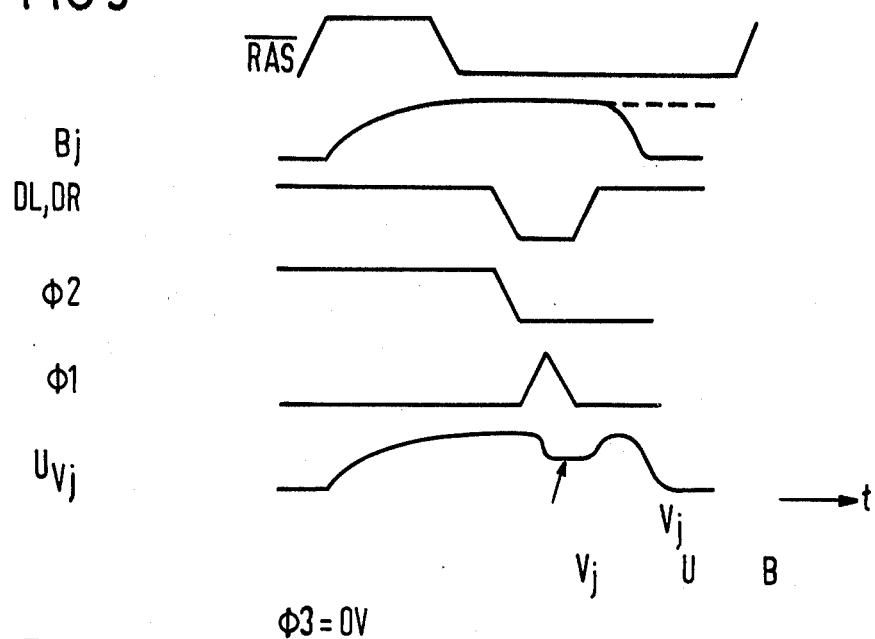
FIGS. 5 and 6 are multiple plot diagrams providing details regarding the electrical behavior of the comparison or dummy cell shown in FIGS. 2 to 4 and the clock control therefor.
Figure 6:
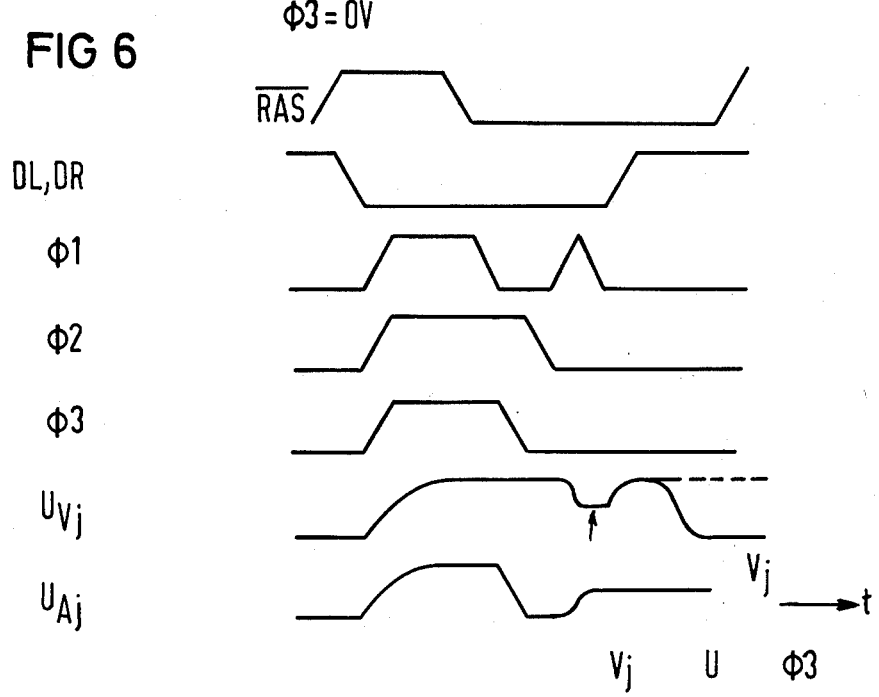

Provided for the control of the gates of the connecting transistors T1 between all the dummy cells $V_j$ and the equalization cells $A_j$ associated therewith is a common clock pulse $\phi_1$, the time diagram of which is shown in FIGS. 5 and 6. Provided for the control of the gate of the transfer transistor T2 in the equalization cells $A_j$ is a common clock signal $\phi_2$ the time behavior or characteristics of which are also shown in FIGS. 5 and 6, whereas a clock signal $\phi_3$ is applied to the source terminal of the transfer transistor T in the provided equalization cells $A_j$. The effect described hereinbefore is realized through the interaction of the clock signals $\phi_1$ to $\phi_3$.

Also apparent from FIGS. 5 and 6 is the time behavior or characteristics of the clock signals $\phi_1$, $\phi_2$, $\phi_3$ with respect to the operating clocks serving the actual storage operation of the DRAM memory, it being further noted that the voltage U between the bit lines $B_j$ and ground, and hence to the substrate is, in the operating state of the individual bit line, the charging voltage for the storage capacities in the dummy cells $V_j$ and in the information storage cells $IZ_{ij}$, and is preferably equal to the supply voltage for the read amplifiers $LV_j$ serving as comparators.

In the diagrams shown in FIGS. 5 and 6, the abscissa represents the time t and the ordinate the pulse voltage which is preferably selected to equal the supply voltage U in all cases. The operating rhythm is fixed by the memory clock pulses RAS which appear periodically and control the information input and readout processes, respectively, in the manner commonly applied to dynamic memories.

Decisive for the time cycle or course during operation of the dummy cells $V_j$ and the equalization cells $A_j$ is, on the one hand, the addressing signal given via one of the word lines $W_i$ and, on the other hand, the addressing signal given simultaneously with this signal to the dummy line D controlling the dummy cell $V_j$. The wave form of the two last-mentioned signals is shown in the second and third diagrams of FIG. 5. Virtually simultaneously with the dummy signal, the potential $\phi_2$ at the gate of the transfer transistor T2 of the equalization cells $A_j$ is reduced to the reference potential $V_{SS}$ and, consequently, to the level "0." The potential $\phi_3$ at the source terminal of this transfer transistor T2 is then likewise $V_{SS}$. As for the rest, the waveform of the voltages shown in the various diagrams of FIGS. 5 and 6 is understandable without difficulty on the basis of the foregoing explanations of the desired behavior or characteristics of the transistors T, T1 and T2 (which, like the transfer transistors t in the information storage cells, are of the enhancement type).

There is claimed:

1. Monolithically integrated semiconductor memory having a matrix formed of identical information storage cells arranged in rows and columns in the form of single-transistor storage cells, a respective comparator and a dummy cell, likewise provided by a single-transistor storage cell, being operatively associated either with each matrix column or each matrix row, comprising a respective second single-transistor storage cell provided as a charge equalization cell and identical, at least with respect to storage capacity with the dummy cell and operatively associated with each of the dummy cells, each of said charge equalization cells respectively having a drive balanced relative to the drive of the dummy cell operatively associated therewith so that, in a first phase triggered by the respective dummy cell having been addressed by an addressing signal, the dummy cell storage capacity is charged and the charging state of the storage capacity of the respective charge equalization cell is set so that the charging state in said charge equalization cell corresponds to the signal inverse to said addressing signal effecting the charging of the dummy cell, so that, in a second operating phase, the storage capacity of the dummy cell and the storage capacity of said charge equalization cell are connected in parallel for charge equalization, and so that, in a third operating phase, the respective storage capacities of the dummy cell and said charge equalization cell are again separated by driving the comparator from the dummy cell.

2. Semiconductor memory according to claim 1 having the construction of a dynamic RAM memory.

3. Semiconductor memory according to claim 1 wherein the information storage cells, the dummy cells and said charge equalization cells respectively formed as single-transistor storage cells are mutually identical and producible together simultaneously.

4. Semiconductor memory according to claim 1 wherein the comparators are formed as differential amplifiers, and the pulses of said addressing signal for the dummy cells having an amplitude equal to that of the supply voltage for the comparators.

5. Semiconductor memory according to claim 1 wherein said storage capacities of the individual dummy cells and of said charge equalization cells associated therewith, respectively, have a first pole permanently connected to a reference potential, said storage capacities of the dummy cells, respectively having a second pole connected to a bit line operatively associated with the dummy cells via a transfer transistor of the respective dummy cell and also connected via another respective transfer transistor to a second pole of the respective storage capacities of said charge equalization cells associated with the dummy cells, and said second pole of said storage capacities, respectively, of said charge equalization cells being connected to a current-carrying terminal of respective further transfer transistors of said charge equalization cells.

6. Semiconductor memory according to claim 5 wherein said further transfer transistors, respectively, of said charge equalization cells have a gate, said gate and an electrode forming said current-carrying terminal of said further transfer transistors, respectively being acted upon by a respective clock pulse in a manner that before respective activation of said further transfer transistors, respectively, which are controlled by a further clock pulse and which forms the connection of the storage capacity of the dummy cell to the storage capacity of the charge equalization cell, the charge state in the charge equalization cell required for charge equalization between the storage capacities of the dummy cells and the charge equalization cells is set at half the memory charge.

* * * * *